United States Patent
Sato

(10) Patent No.: US 9,025,363 B2
(45) Date of Patent: May 5, 2015

(54) MEMORY DEVICE AND ELECTRONIC APPARATUS

(75) Inventor: Junichi Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 413 days.

(21) Appl. No.: 13/585,035

(22) Filed: Aug. 14, 2012

(65) Prior Publication Data

US 2013/0100733 A1 Apr. 25, 2013

(30) Foreign Application Priority Data

Oct. 19, 2011 (JP) .................................. 2011-229919

(51) Int. Cl.
*G11C 11/00* (2006.01)
*G11C 11/16* (2006.01)

(52) U.S. Cl.
CPC ......... *G11C 11/1675* (2013.01); *Y10S 977/933* (2013.01); *Y10S 977/935* (2013.01)

(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 438/3; 977/933–935
See application file for complete search history.

(56) References Cited

U.S. PATENT DOCUMENTS

| | | | | |
|---|---|---|---|---|
| 6,163,477 A * | 12/2000 | Tran | ............................... | 365/173 |
| 7,948,783 B2 | 5/2011 | Sugibayashi et al. | | |
| 2001/0025978 A1 | 10/2001 | Nakao | | |
| 2005/0128793 A1* | 6/2005 | Ho et al. | ........................ | 365/158 |
| 2008/0273376 A1 | 11/2008 | Gabelich | | |
| 2010/0046284 A1 | 2/2010 | Sugibayshi et al. | | |
| 2010/0146641 A1 | 6/2010 | Lenssen et al. | | |

FOREIGN PATENT DOCUMENTS

| | | |
|---|---|---|
| JP | 2000-299517 | 10/2000 |
| JP | 2001-250206 | 9/2001 |
| JP | 2006-511892 | 4/2006 |
| WO | WO 2008/062686 | 5/2008 |

OTHER PUBLICATIONS

Japanese Office Action for corresponding Japanese Patent Application No. 2011-229919, issued Jan. 27, 2015, 8 pages.

* cited by examiner

*Primary Examiner* — Harry W Byrne
(74) *Attorney, Agent, or Firm* — Staas & Halsey LLP

(57) ABSTRACT

A memory device includes: a memory including a first magnetic layer having no retaining force and a second magnetic layer having a retaining force, the first magnetic layer and the second magnetic layer being stacked; a first magnet to magnetize the first magnetic layer in a first direction; and a second magnet to apply a magnetic field to a region through which the memory passes when the memory is removed and to magnetize the second magnetic layer in a second direction.

13 Claims, 18 Drawing Sheets

FIG. 16A
FIG. 16B
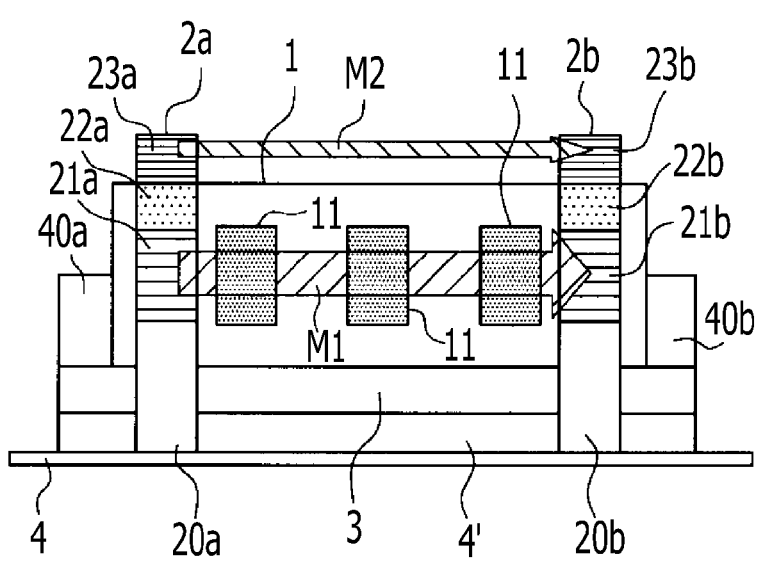
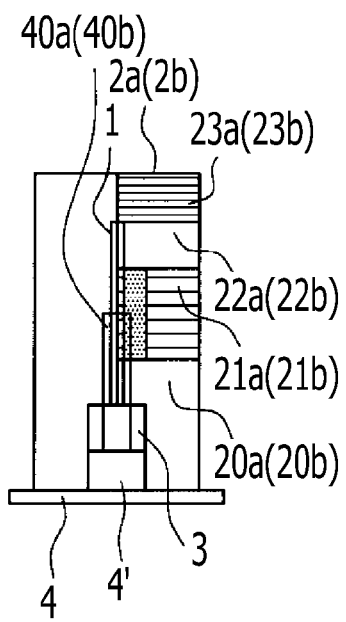

MEMORY DEVICE AND ELECTRONIC APPARATUS

CROSS-REFERENCE TO RELATED APPLICATION(S)

This application is based upon and claims the benefit of priority of the prior Japanese Patent Application No. 2011-229919, filed on Oct. 19, 2011, the entire contents of which are incorporated herein by reference.

FIELD

The embodiments discussed herein are related to a memory device and an electronic apparatus.

BACKGROUND

Magnetic memory devices that include magnetoresistive random access memory (MRAM) have a function as a non-volatile memory, and have high-speed access performance (for example, about 35 ns) that is equivalent to that of static random access memory (SRAM).

Memory cells of the magnetic memory devices store information using magnetic moment, and therefore allow data storage and highly reliable rewriting cycles under high-temperature circumstances.

Related technologies are disclosed in Japanese National Publication of International Patent Application No. 2006-511892 and International Publication Pamphlet No. WO 08/062686.

SUMMARY

According to an aspect of the invention, a memory device includes: a memory including a first magnetic layer having no retaining force and a second magnetic layer having a retaining force, the first magnetic layer and the second magnetic layer being stacked; a first magnet to magnetize the first magnetic layer in a first direction; and a second magnet to apply a magnetic field to a region through which the memory passes when the memory is removed and to magnetize the second magnetic layer in a second direction.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 16A and 16B illustrate an exemplary magnetic memory device.

DESCRIPTION OF EMBODIMENTS

Magnetic memory devices such as MRAM may be used in place of SRAM or battery-driven dynamic random access memory (DRAM).

Data in a magnetic memory device that has been removed from a personal computer or the like may be illegally read out or altered.

Figure 1:
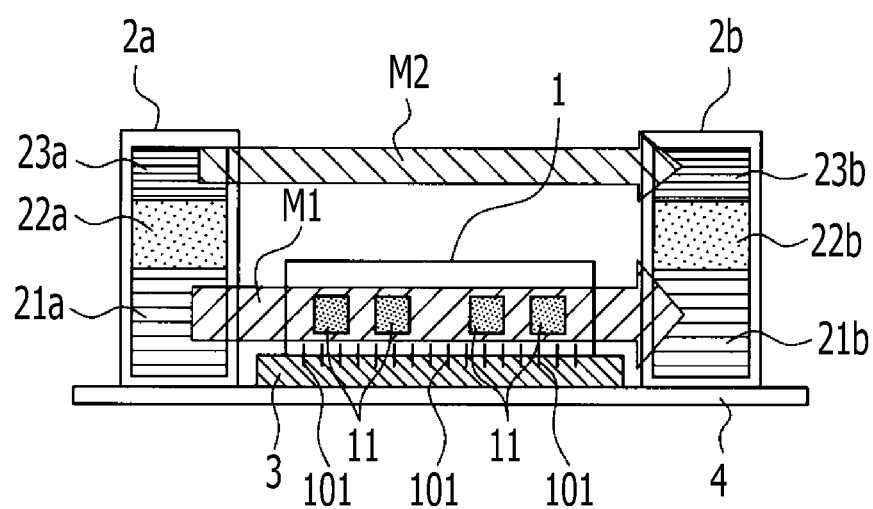
FIG. 1 illustrates an exemplary magnetic memory device.

FIG. 1 illustrates an exemplary magnetic memory device (MRAM). FIG. 1 illustrates a side view of the magnetic memory device (MRAM) in use.

In FIG. 1, reference numeral 1 denotes an MRAM main body (magnetic memory main body), 2a and 2b each denote a magnetic composite body (a magnetic field generating unit), 3 denotes a connector, and 4 denotes a substrate (for example, a motherboard of a target apparatus).

Reference numeral 11 denotes an MRAM element, 21a and 21b each denote a first anisotropic magnet (first magnetic field generating magnet) that generates a first magnetic field M1, 22a and 22b each denote a shielding material, and 23a and 23b each denote a second anisotropic magnet (second magnetic field generating magnet) that generates a second magnetic field M2.

In the MRAM illustrated in FIG. 1, the MRAM main body 1 that includes a plurality of MRAM elements 11 may be independent. For example, the MRAM main body 1 may be coupled through the connector 3 to the substrate 4 of a personal computer or the like so as to be easily removable.

The MRAM main body 1 is electrically coupled to wiring of the substrate 4 via a plurality of metal terminals (connection pins) 101 included in the MRAM main body 1 and the connector 3.

Two magnetic composite bodies 2a and 2b are fixed to the substrate 4 on both sides of the MRAM main body 1. The magnetic composite bodies 2a and 2b may be firmly secured to the substrate 4 using an adhesive or the like, for example. The magnetic composite bodies 2a and 2b may be attached to the substrate 4 so as not to be removable together with the MRAM main body 1.

In one of the magnetic composite bodies, 2a, the second anisotropic magnet 23a is provided above the first anisotropic magnet 21a via the shielding material 22a. In the other magnetic composite body 2b, the second anisotropic magnet 23b is provided above the first anisotropic magnet 21b via the shielding material 22b.

Although both the direction of the first magnetic field M1 based on the first anisotropic magnets 21a and 21b and the direction of the second magnetic field M2 based on the second anisotropic magnets 23a and 23b are indicated as from the left to the right in FIG. 1, the directions of the magnetic fields may be opposite to each other. For example, the first magnetic field M1 may be directed from the right to the left.

The shielding materials 22a and 22b may be disposed so that the first anisotropic magnets 21a and 21b and the second anisotropic magnets 23a and 23b do not affect each other in the magnetic composite bodies 2a and 2b.

The first magnetic field M1 based on the first anisotropic magnets 21a and 21b may be disposed so as to have an intensity that is sufficient for lower magnetic layers (first magnetic layers) of the MRAM elements 11 to function as MRAM and that does not affect magnetization reversal of upper free layers (second magnetic layers) of the MRAM elements 11. The first magnetic field M1 may be configured to have an appropriate intensity based on the distance between the first anisotropic magnets 21a and 21b, for example.

The second magnetic field M2 based on the second anisotropic magnets 23a and 23b may be disposed so as to have an intensity that forcedly reverses the direction of magnetization of the upper free layers (113) of the MRAM elements 11 when the MRAM main body 1 is removed and that does not affect the MRAM elements 11 in a normal state of use. The second magnetic field M2 is configured to have an appropriate intensity based on the distance between the second anisotropic magnets 23a and 23b, for example.

The first anisotropic magnets 21a and 21b and the second anisotropic magnets 23a and 23b of the magnetic composite bodies 2a and 2b may be something other than anisotropic magnets. When magnets with no directional properties are used, for example, the gap between the magnets 21a and 21b and between the magnets 23a and 23b may be set to be wide, for example, by changing the material of or adjusting the thickness of the shielding materials 22a and 22b.

Figures 2A, 2B:
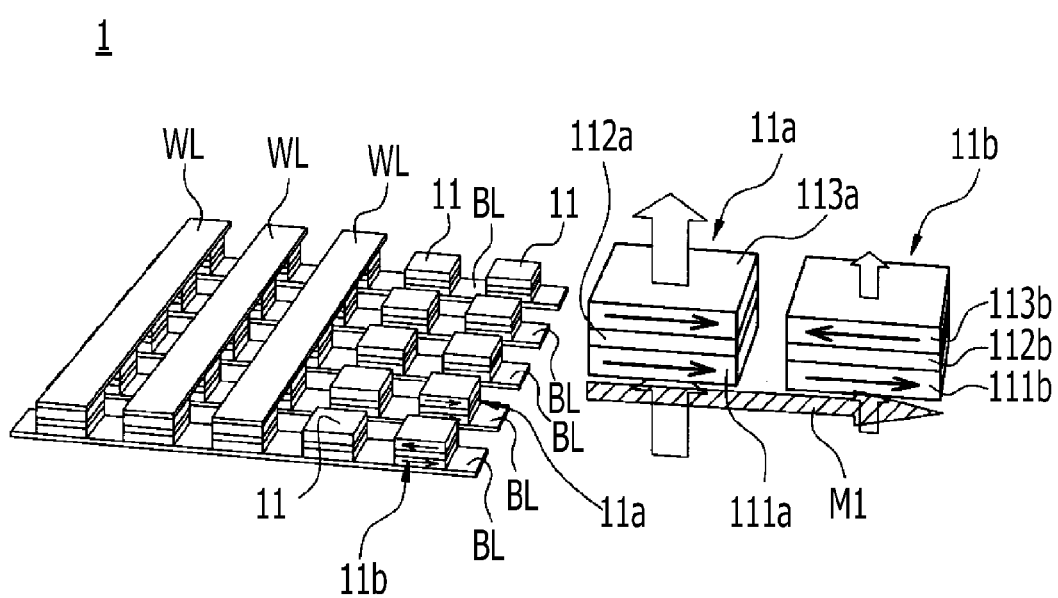
FIGS. 2A and 2B illustrate an exemplary MRAM main body.

FIGS. 2A and 2B illustrate an exemplary MRAM main body. The MRAM main body illustrated in FIGS. 2A and 2B may be disposed in the magnetic memory device illustrated in FIG. 1. FIG. 2A illustrates the MRAM main body 1. FIG. 2B illustrates the MRAM elements 11 (11a, 11b).

The upper free layers (second magnetic layers) 113 correspond to a magnetic material (ferromagnetic material) that has a retaining force, and retain magnetization in the spin direction that corresponds to data to be written. The lower magnetic layers (first magnetic layers) 111 correspond to a magnetic material (ferromagnetic material) that has no retaining force, and are magnetized by an external magnetic force. When the magnetic force is lost, the lower magnetic layers 111 are demagnetized.

As illustrated in FIG. 2A, for data to be written into each of the MRAM elements 11, the spin direction of the upper free layers 113 (113a, 113b) is decided based on the direction of a writing current flowing through word lines WL, for example. Insulating layers 112 (112a, 112b) are provided between the upper free layers 113 (113a, 113b) and the lower magnetic layers 111 (111a, 111b).

As illustrated in FIG. 2B, the direction of the first magnetic field M1 that is based on the first anisotropic magnets 21a and 21b which prescribe the direction of magnetization of the lower magnetic layers 111, may be substantially the same as (or may be substantially opposite to) the direction of magnetization of the upper free layers 113.

The direction of magnetization of the MRAM elements 11 provided in the MRAM main body 1, or the direction of a memory chip having a plurality of MRAM elements set to the direction of magnetization, may substantially coincide with the direction of the first magnetic field M1 and the second magnetic field M2.

The MRAM element 11a is an element (magnetic tunnel junction (MTJ) element) with data "0" in which the spin directions of the lower magnetic layer 111a and the upper free layer 113a are substantially the same as each other.

The MRAM element 11b is an element (MTJ element) with data "1" in which the spin directions of the lower magnetic layer 111b and the upper free layer 113b are opposite to each other. A large current may flow through the MRAM element (1-MTJ element) 11a with data "0". A small current may flow through the 1-MTJ element 11b with data "1".

Figure 3:
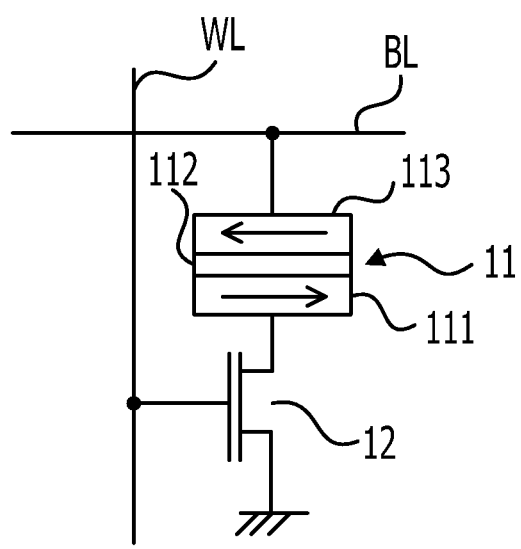
FIG. 3 illustrates an exemplary MRAM element.

FIG. 3 illustrates an exemplary an MRAM element. The MRAM element illustrated in FIG. 3 may be included in the MRAM main body 1 illustrated in FIGS. 2A and 2B, and includes a transistor 12 for read out. The MRAM element 11, which is provided at the intersection of the word line WL and a bit line BL, reads out data based on the magnitude of a current in the spin direction of the upper free layer 113.

The transistor 12 is turned on based on a signal from the word line WL. A difference in magnitude of a current based on the spin directions of the lower magnetic layer 111 and the upper free layer 113 of the MRAM element 11 is detected via the bit line BL. Stored data is thus read out.

In FIG. 3, the MRAM element 11 stores data "1" where the spin directions of the lower magnetic layer 111 and the upper free layer 113 are opposite to each other and with a current flowing is small. Data "0" may be read out in substantially the same manner. The configuration of the MRAM element 11 is not limited to the configuration illustrated in FIGS. 2A, 2B, and 3.

The direction of magnetization of the upper free layer 113 is reversed by a magnetic field based on the writing current. The direction of magnetization may not be reversed by a magnetic force of the first anisotropic magnets 21a and 21b of the magnetic composite bodies 2a and 2b.

The lower magnetic layer 111 may be a magnetic material having no retaining force. The direction of magnetization of the lower magnetic layer 111 is decided based on an external magnetic force from the first anisotropic magnets 21a and 21b of the magnetic composite bodies 2a and 2b. When the external magnetic force is lost, the lower magnetic layer 111 is demagnetized.

In the MRAM element 11, the direction of magnetization of the lower magnetic layer 111 is decided based on an external magnetic force, and the direction of magnetization of the upper free layer 113 is decided based on the magnetic field of a writing current.

When the spin directions of the lower magnetic layer 111 and the upper free layer 113 are substantially the same as each other, the electrical resistance of the MRAM element 11 becomes low, and data (logical value) "0" is retained. When the spin directions are opposite to each other, data "1" is retained.

Figure 4:
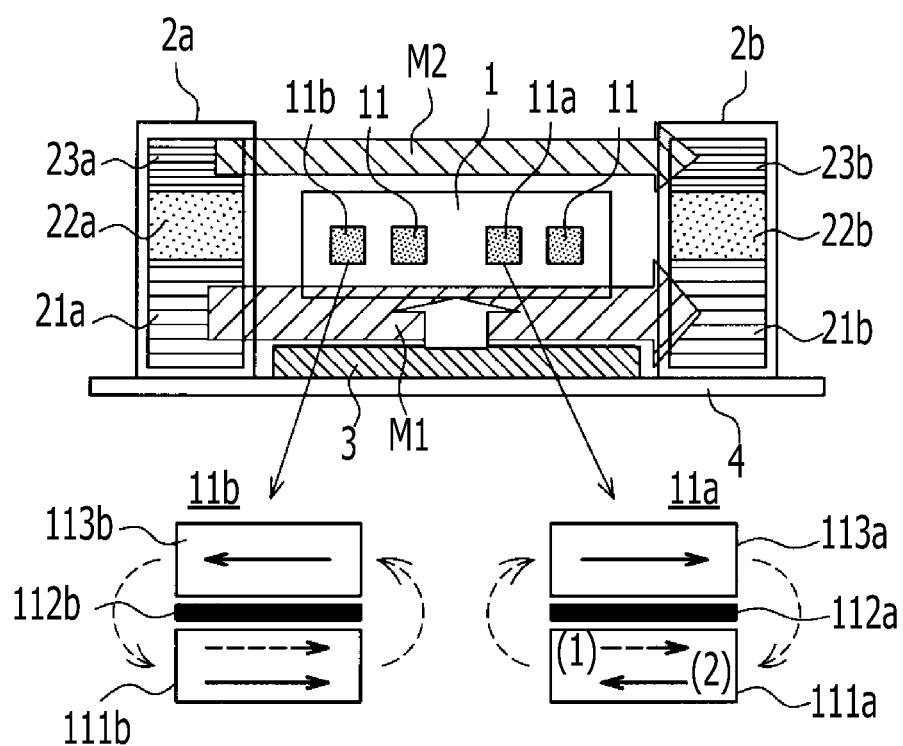
FIG. 4 illustrates an exemplary magnetic memory device.
Figure 5:
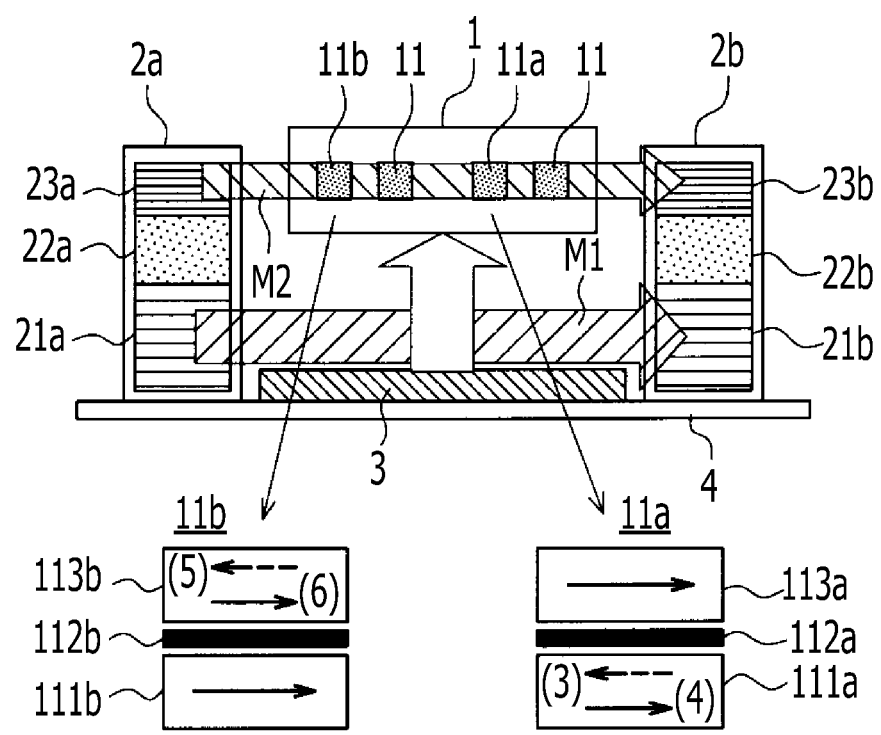
FIG. 5 illustrates an exemplary magnetic memory device.
Figure 6:
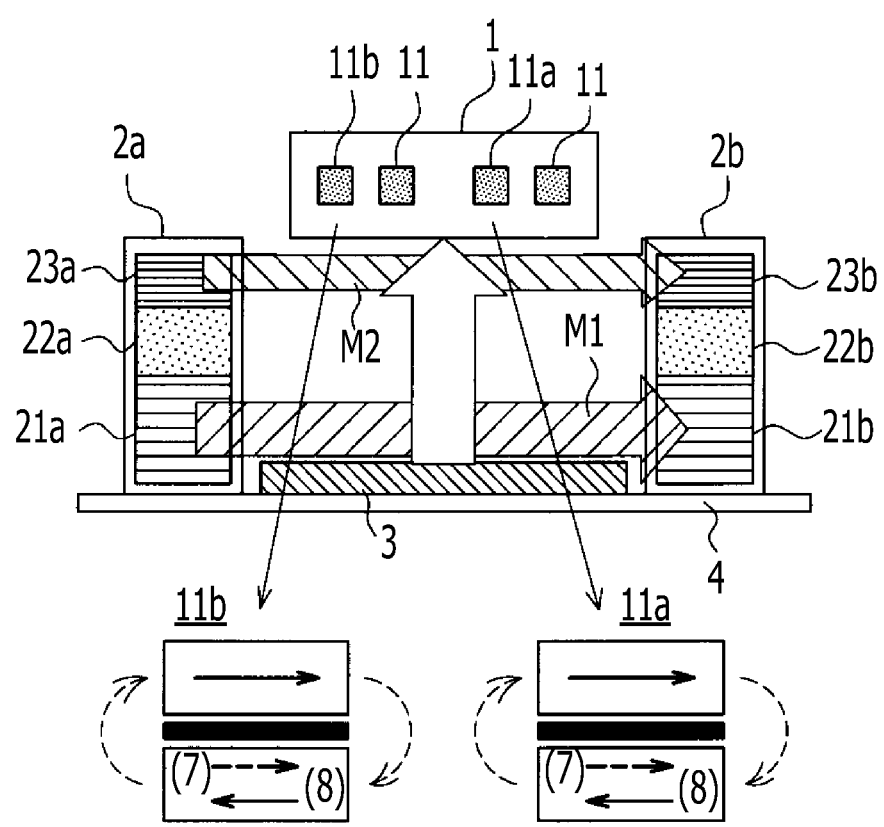
FIG. 6 illustrates an exemplary magnetic memory device.

FIGS. 4 to 6 illustrate an exemplary magnetic memory device. FIG. 4 illustrates a state in which the MRAM main body 1 is disconnected from the connector 3. FIG. 5 illustrates a state in which the MRAM main body 1 is affected by the second magnetic field M2. FIG. 6 illustrates a state in which the MRAM main body 1 is completely removed.

When the MRAM main body (magnetic memory main body) 1 is attached to the substrate 4 via the connector 3, the magnetic memory device operates normally. When the MRAM main body 1 is disconnected from the connector 3, data stored in the magnetic memory device may be disrupted.

When the MRAM main body 1 is disconnected from the connector 3 (substrate 4), as illustrated in FIG. 4, the MRAM main body 1 (MRAM elements 11) is displaced from the center of the first magnetic field M1 that is based on the first anisotropic magnets 21a and 21b of the magnetic composite bodies 2a and 2b.

The lower magnetic layers 111 (111a, 111b) of the MRAM elements 11 (11a, 11b) are no longer supplied with a sufficient magnetic field (for example, the first magnetic field M1) for magnetization. Since the lower magnetic layers 111 of the MRAM elements 11 do not have a retaining force, the lower magnetic layers 111 may be affected by a magnetic field leaking from the upper free layers 113.

For example, the lower magnetic layer 111a of the MRAM element 11a, which stores data "0", changes its direction from the direction (1), which is the same as the direction of the upper free layer 113a, to the opposite direction (2). The lower magnetic layer 111b of the MRAM element 11b, which stores data "1", maintains its direction, which is opposite to the direction of the upper free layer 113b.

The lower magnetic layers 111 (111a, 111b) of the MRAM elements 11 (11a, 11b) are magnetized in the direction opposite to the direction of magnetization of the upper free layers 113 (113a, 113b), and may lose a memory function that is for retaining data. As illustrated in FIG. 4, the upper free layer 113 of each MRAM element 11 retains a direction of magnetization corresponding to the stored data.

When the MRAM main body 1 is moved away from the substrate 4, as illustrated in FIG. 5, the MRAM main body 1 (MRAM elements 11) may be located at the center of the second magnetic field M2 that is based on the second anisotropic magnets 23a and 23b of the magnetic composite bodies 2a and 2b.

Therefore, the lower magnetic layer 111a of the MRAM element 11a, which stores data "0", changes its direction from the direction (3) to the direction (4) in accordance with the second magnetic field M2. The upper free layer 113b of the MRAM element 11b, which stores data "1", changes its direction from the direction (5) to the direction (6) in accordance with the second magnetic field M2.

The second magnetic field M2 based on the second anisotropic magnets 23a and 23b of the magnetic composite bodies 2a and 2b has an intensity that forcibly changes the direction of magnetization of the upper free layers 113 (113a, 113b) of the MRAM elements 11 (11a, 11b). Therefore, the upper free layers 113 are magnetized in substantially the same direction.

The second magnetic field M2 forcibly magnetizes the lower magnetic layers 111 (111a, 111b) of the MRAM elements 11 (11a, 11b) in substantially the same direction. Therefore, the upper free layers 113 and the lower magnetic layers 111 of the MRAM elements 11 included in the MRAM main body 1 are magnetized in the direction of magnetization of the second magnetic field M2, which may disrupt data stored in the MRAM main body 1.

When the MRAM main body 1 is moved away from the substrate 4, as illustrated in FIG. 6, the MRAM main body 1 (MRAM elements 11) is displaced from the center of the second magnetic field M2 that is based on the second anisotropic magnets 23a and 23b of the magnetic composite bodies 2a and 2b.

The lower magnetic layers 111 (111a, 111b) of the MRAM elements 11 (11a, 11b) are no longer supplied with a sufficient magnetic field (second magnetic field M2) for magnetization. Since the lower magnetic layers 111 of the MRAM elements 11 do not have a retaining force, the lower magnetic layers 111 may be affected by a magnetic field leaking from the upper free layers 113.

The lower magnetic layers 111 (111a, 111b) of the MRAM elements 11 (11a, 11b) are affected by a magnetic field leaking from the upper free layers 113 (113a, 113b) to be magnetized out of the direction (7) into the direction (8), which is opposite to the direction of magnetization of the upper free layers 113 (113a, 113b).

The lower magnetic layers 111 of the MRAM elements 11 are magnetized into the direction opposite to the direction of magnetization of the upper free layers 113, and data stored in the MRAM main body 1 may be disrupted (erased). The MRAM main body 1 is separated from the first anisotropic magnets 21a and 21b, and therefore the function as a memory that stores data may be lost.

The magnetic memory device (MRAM) is used as a memory that stores data with the MRAM main body 1 inserted into the connector 3 as illustrated in FIG. 1, for example. After data is initialized, the magnetic memory device (MRAM) may be used as a new magnetic memory device.

The MRAM elements 11 built in the MRAM main body 1 may be formed as a single memory chip, or may be formed as a plurality of memory chips arranged horizontally or vertically.

A plurality of memory chips may be stacked on each other when the first magnetic field M1 based on the first anisotropic magnets 21a and 21b of the magnetic composite bodies 2a and 2b magnetizes the lower magnetic layers 111 of the MRAM elements 11 during use of the MRAM.

With the magnetic memory device, electric power for disruption of stored data may become relatively low. Because data disruption is based on physical changes in the state of memory elements, the possibility of data read-out or decoding (alteration) after the data disruption may be reduced.

In the absence of an external magnetic field (first magnetic field M1), the magnetic memory device does not function as a memory even if data are electrically rewritten by supplying electric power to the magnetic memory device. This reduces the possibility of data leakage that may occur when the magnetic memory device is taken out.

The magnetic memory main body 1 does not incorporate an external magnetic field supply source such as a magnet. Therefore, an external magnetic field supply source may be easily blocked from inappropriately removing data. The magnetic memory main body 1 is not broken by the blockage of an external magnetic field supply source. Therefore, the magnetic memory main body 1 may be reused.

Figure 7:
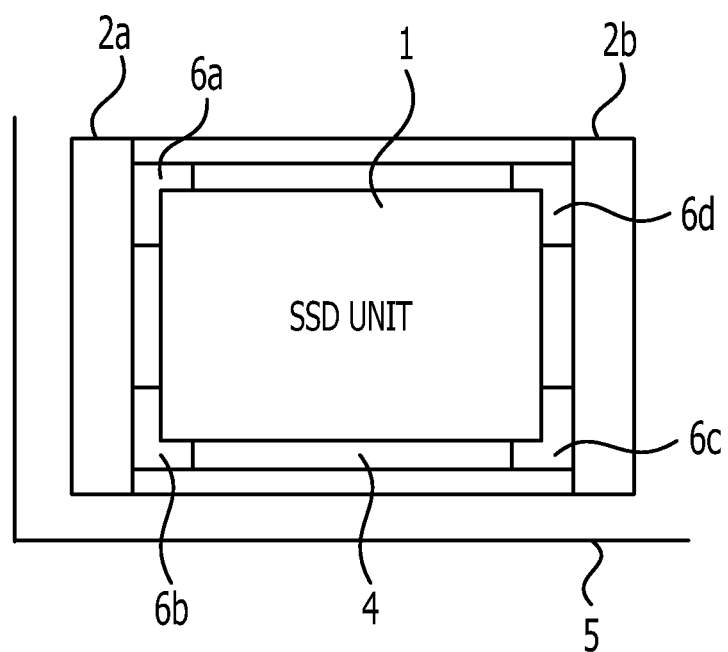
FIG. 7 illustrates an exemplary magnetic memory device.

FIG. 7 illustrates an exemplary magnetic memory device. FIG. 7 may be a solid state drive (SSD) type magnetic memory device. FIG. 7 is a bottom view of a laptop personal computer 5 on which an SSD-type magnetic memory device is mounted.

Figure 8:
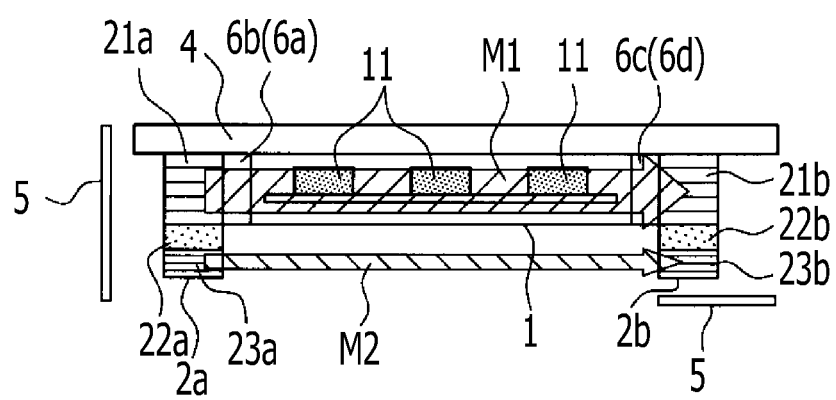
FIG. 8 illustrates an exemplary magnetic memory device.
Figure 9:
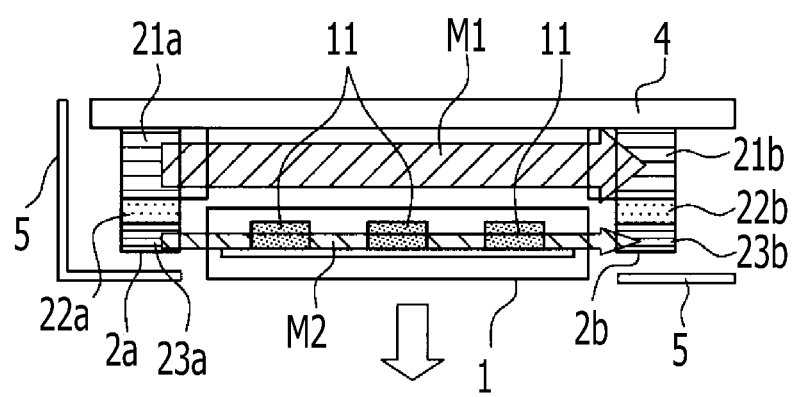
FIG. 9 illustrates an exemplary magnetic memory device.

FIGS. 8 and 9 illustrate an exemplary magnetic memory device. FIG. 8 illustrates the SSD-type magnetic memory device in use. FIG. 9 illustrates a state in which an MRAM main body is removed from the SSD-type magnetic memory device.

An SSD that uses flash memory may be used in place of a hard disk drive (HDD) of the laptop personal computer 5, for example.

With the SSD-type magnetic memory device, as illustrated in FIG. 7, an SSD unit 1 (with an MRAM main body) is removably attached to the substrate 4 that is at the bottom surface of the laptop personal computer 5.

Shock absorbing materials 6a to 6d are provided at the four corners of the SSD unit 1. A gap having a given distance is provided between the magnetic composite bodies 2a and 2b and the SSD unit 1. The magnetic composite bodies 2a and 2b are fixed to the substrate (for example, a motherboard) 4 of the laptop personal computer 5. Connection between the SSD unit 1 and a connector of the substrate 4 is not illustrated, and may be coupled in substantially the same manner as the attachment of the SSD.

FIGS. 8 and 9 may correspond to FIGS. 1 and 5, respectively. FIGS. 8 and 9 illustrate mounting on the bottom surface of the laptop personal computer 5, and therefore are inverted from FIGS. 1 and 5 in the vertical direction.

As illustrated in FIG. 8, the SSD unit 1 is attached in tight contact with the substrate 4. When the SSD unit 1 is attached to the substrate 4, the first magnetic field M1 may have an intensity that is sufficient for the lower magnetic layers of the MRAM elements 11 to function as MRAM and that does not affect magnetization reversal of the upper free layers.

When the SSD unit 1 is removed from the substrate 4, for example when the SSD unit 1 is removed along with downward movement indicated by an arrow, as illustrated in FIG. 9, stored data may be disrupted (erased) as illustrated in FIGS. 4 to 6.

When the SSD unit 1 is removed from the substrate 4, the second magnetic field M2 may have an intensity that forcibly reverses the direction of magnetization of the upper free layers of the MRAM elements 11 and that does not affect the MRAM elements 11 in a normal state of use.

In the magnetic composite bodies 2a and 2b, for example, the first anisotropic magnets 21a and 21b, the shielding materials 22a and 22b, and the second anisotropic magnets 23a and 23b are coated with plastic or the like, which may reduce the ease of disassembly.

The magnetic composite bodies 2a and 2b, in which the first anisotropic magnets 21a and 21b, the shielding materials 22a and 22b, and the second anisotropic magnets 23a and 23b are stacked on each other, are packaged to be fixed to the substrate 4.

The magnetic composite bodies 2a and 2b may be fixed to the substrate 4 using various joining techniques so as not to be easily removable from the substrate 4. The magnetic composite bodies 2a and 2b may be fixed so as not to be removable together with the SSD unit 1.

The MRAM elements 11 illustrated in FIGS. 8 and 9 may be formed as a memory chip that includes a plurality of MRAM elements. The SSD unit 1 may be used for apparatuses such as laptop personal computers, desktop personal computers, and other electronic devices.

Figure 10:
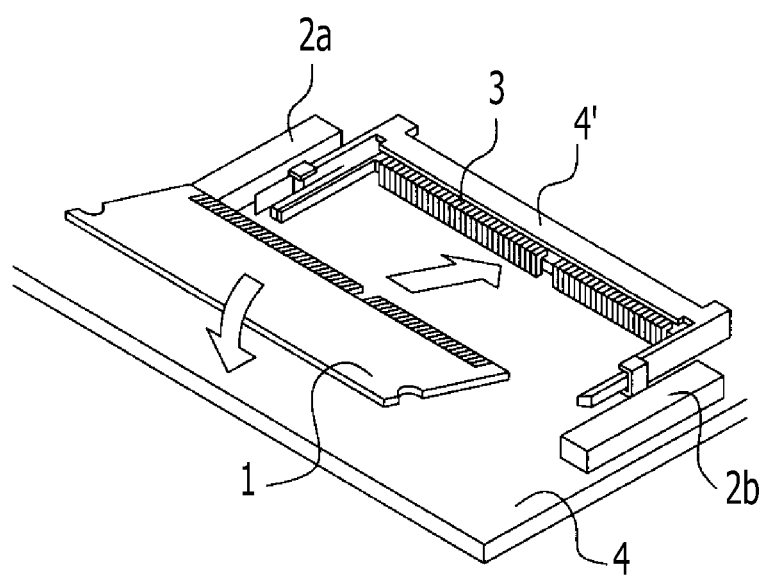
FIG. 10 illustrates an exemplary magnetic memory device.
Figure 11:
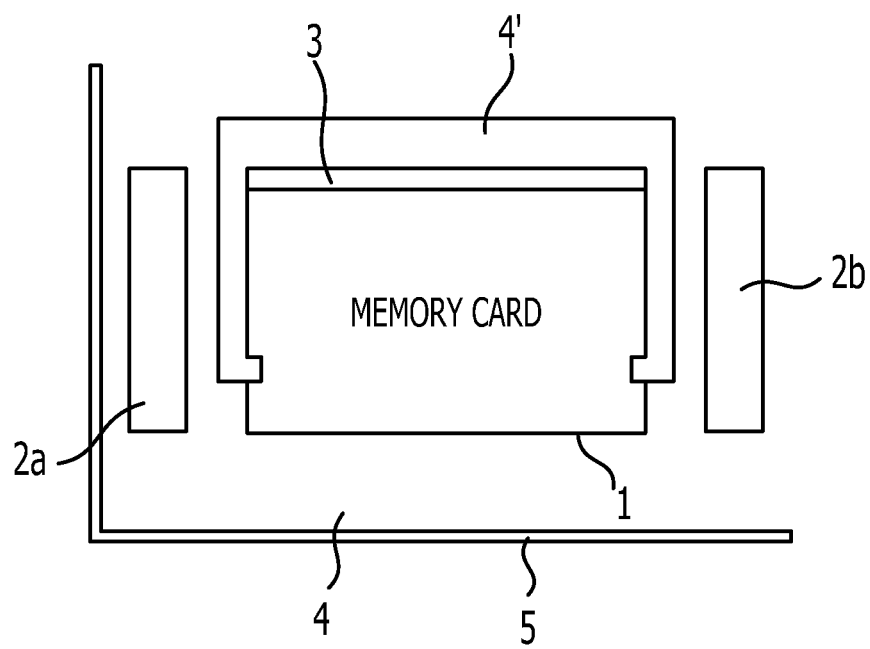
FIG. 11 illustrates an exemplary magnetic memory device.

FIGS. 10 and 11 illustrate an exemplary magnetic memory device. The magnetic memory device illustrated in FIGS. 10 and 11 may be a small outline dual in-line memory module (SO-DIMM) type magnetic memory device for use in a laptop personal computer. FIG. 10 is a perspective view of the magnetic memory device. FIG. 11 is a bottom view of the magnetic memory device.

In the SO-DIMM-type magnetic memory device illustrated in FIGS. 10 and 11, for example, an SO-DIMM unit (with an MRAM main body) 1 is removably attached to a memory socket 4' (substrate 4) via the connector 3.

The SO-DIMM unit 1 may be shaped in substantially the same manner as an SO-DIMM for use in a laptop personal computer, for example, and may be attached and removed in substantially the same manner as the SO-DIMM for use in a laptop personal computer.

In the SO-DIMM-type magnetic memory device, the magnetic composite bodies 2a and 2b are fixed to both sides of the memory socket 4' of the substrate (for example, a motherboard) 4 of the laptop personal computer 5.

Figure 12:
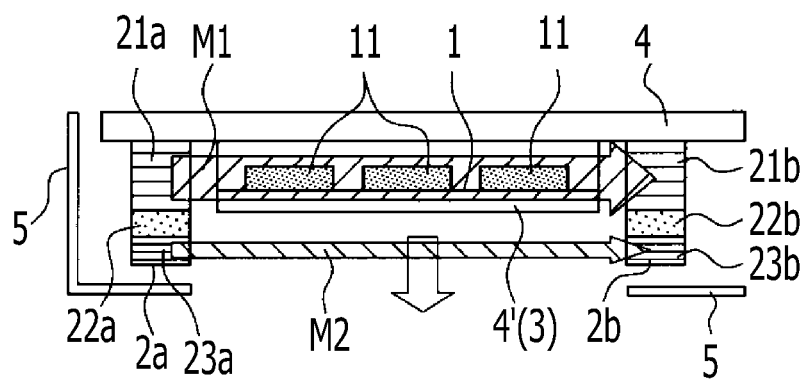
FIG. 12 illustrates an exemplary magnetic memory device.
Figure 13B:
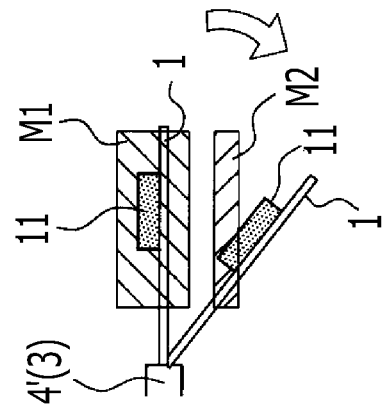
FIGS. 13A and 13B illustrate an exemplary magnetic memory device.
Figure 13A:
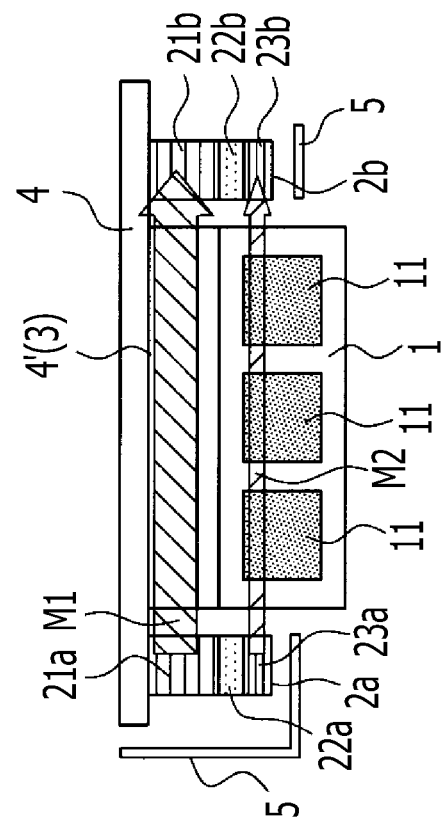

FIG. 12 illustrates an exemplary magnetic memory device. FIG. 12 illustrates the SO-DIMM-type magnetic memory device in use. FIGS. 13A and 13B illustrate an exemplary magnetic memory device. FIGS. 13A and 13B illustrate a state in which an MRAM main body is removed from the SO-DIMM-type magnetic memory device.

FIG. 13A is a bottom view illustrating a state in which the SO-DIMM unit (with an MRAM main body) 1 projects from a memory socket 4'. FIG. 13B is a side view of the state illustrated in FIG. 13A, illustrating movement of the SO-DIMM unit 1. FIGS. 12 and 13A and 13B may correspond to FIGS. 1 and 5 or FIGS. 8 and 9, respectively.

As illustrated in FIG. 12, the SO-DIMM unit 1 is fitted into the memory socket 4' that has the connector 3 to be attached to the substrate 4. When the SO-DIMM unit 1 is attached to the substrate 4, the first magnetic field M1 may have an intensity that is sufficient for the lower magnetic layers of the MRAM elements (memory chips) 11 to function as MRAM and that does not affect magnetization reversal of the upper free layers.

When the SO-DIMM unit 1 is removed from the substrate 4, for example when the SO-DIMM unit 1 is rotated downward as indicated by an arrow to be removed from the memory socket 4', as illustrated in FIGS. 13A and 13B, stored data may be disrupted.

When the SO-DIMM unit 1 is removed from the memory socket 4' (substrate 4), the second magnetic field 2 may not be applied to all the MRAM elements 11 (all the MRAM elements of the memory chips 11) at the same time, for example. However, all the data in the MRAM elements 11 may be disrupted.

The SO-DIMM-type magnetic memory device may be provided with the magnetic composite bodies 2a and 2b, and may be provided as the SO-DIMM unit 1 for a laptop personal computer in substantially the same manner as an SO-DIMM for a laptop personal computer.

Figure 14:
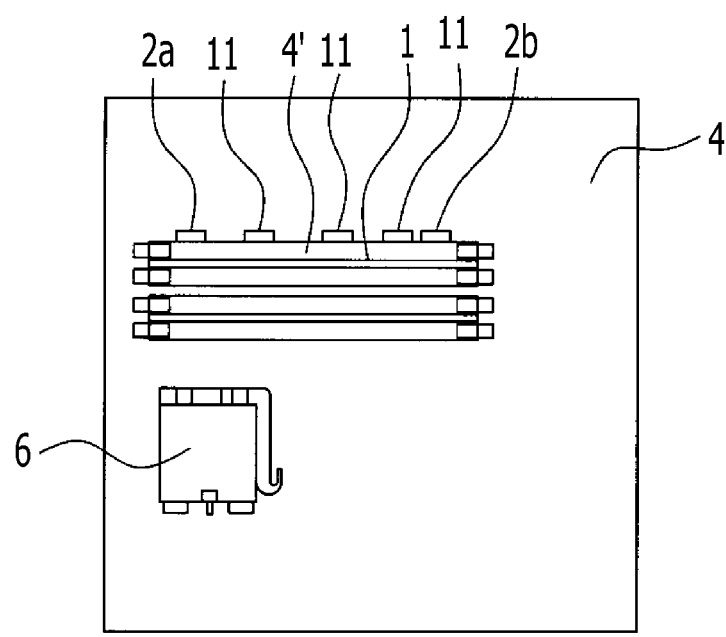
FIG. 14 illustrates an exemplary magnetic memory device.
Figure 15:
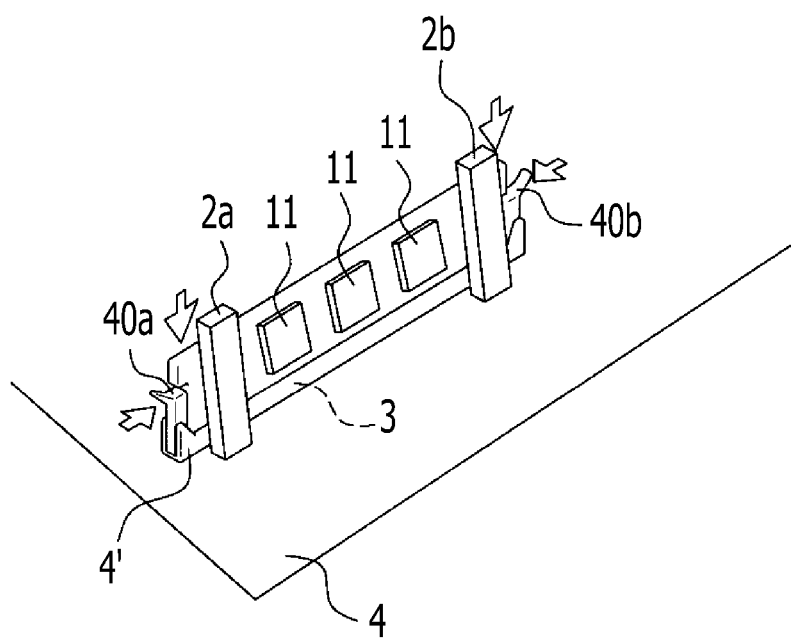
FIG. 15 illustrates an exemplary magnetic memory device.

FIGS. 14 and 15 illustrate an exemplary magnetic memory device. FIG. 14 illustrates an SO-DIMM-type magnetic memory device for use in a desktop personal computer. FIG. 15 illustrates a state in which an SO-DIMM unit is attached to a memory socket.

In the SO-DIMM-type magnetic memory device illustrated in FIGS. 14 and 15, for example, an SO-DIMM unit (with an MRAM main body) 1 is removably attached to a memory socket 4' (substrate 4) via a connector 3. In FIG. 14, reference numeral 6 denotes a central processing unit (CPU).

The SO-DIMM unit 1 may be shaped in substantially the same manner as an SO-DIMM for use in a desktop personal computer, for example, and may be attached and removed in substantially the same manner as the SO-DIMM for use in a desktop personal computer.

For example, the SO-DIMM unit 1 is inserted into the memory socket 4' that has the connector 3. The SO-DIMM unit 1 is firmly attached to the memory socket 4' through connector levers (lock levers) 40a and 40b.

In the SO-DIMM-type magnetic memory device, the magnetic composite bodies 2a and 2b are fixed to both sides of the memory socket 4' of the substrate (for example, a motherboard) 4 of the desktop personal computer.

In FIG. 14, the magnetic composite bodies 2a and 2b are provided for one memory socket 4', among a plurality of (four) memory sockets. However, the magnetic composite bodies 2a and 2b may be provided for all the memory sockets.

In FIG. 15, the magnetic composite bodies 2a and 2b are provided on both sides of a side surface of the SO-DIMM unit 1 on which the memory chips (MRAM elements) 11 are provided.

When the memory chips 11 are provided on both side surfaces of the SO-DIMM unit 1, for example when the memory chips 11 are also provided on the back surface of the SO-DIMM unit 1, the magnetic composite bodies 2a and 2b may also be provided on the back surface.

Figures 17A, 17B:
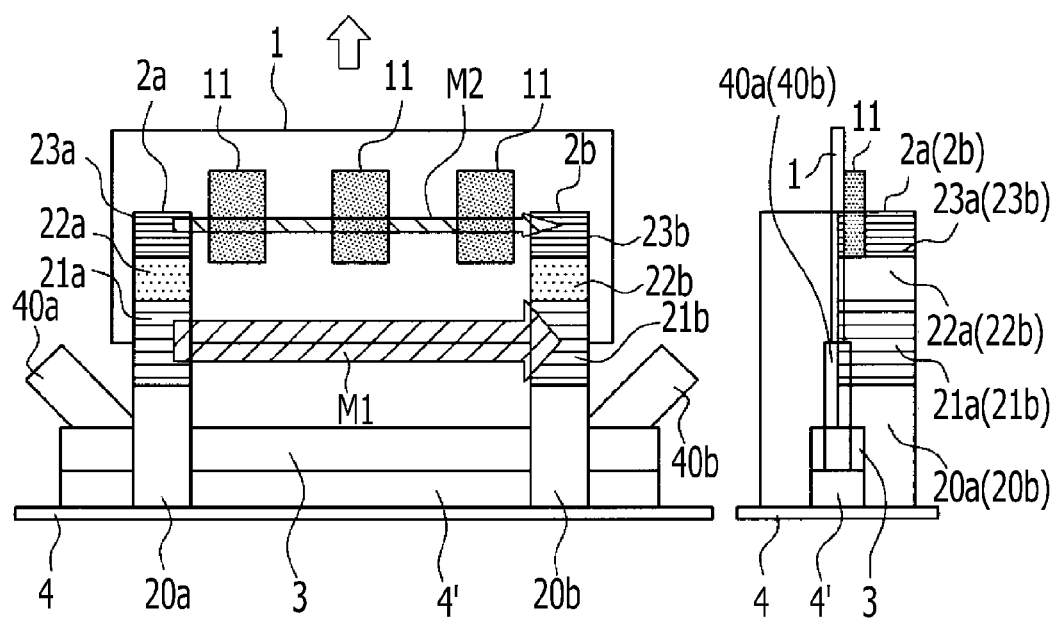
FIGS. 17A and 17B illustrate an exemplary magnetic memory device.

FIGS. 16A and 16B illustrate an exemplary magnetic memory device. FIGS. 16A and 16B illustrate an SO-DIMM-type magnetic memory device in use. FIGS. 17A and 17B illustrate an exemplary magnetic memory device. FIGS. 17A and 17B illustrate a state in which an MRAM main body is removed from the SO-DIMM-type magnetic memory device.

FIGS. 16A and 17A are each a front view of the SO-DIMM unit (MRAM main body) 1 and the memory socket 4'. FIGS. 16B and 17B are each a side view. FIGS. 16A and 16B may correspond to FIG. 1, 8, or 12. FIGS. 17A and 17B may correspond to FIG. 5, 9, or 13A and 13B.

As illustrated in FIGS. 15, 16A, and 16B, the SO-DIMM unit 1 is fitted into the memory socket 4' that has the connector 3, and the SO-DIMM unit 1 is attached to the memory socket 4' through the connector levers 40a and 40b.

When the SO-DIMM unit 1 is attached to the memory socket 4' (substrate 4), the first magnetic field M1 may have an intensity that is sufficient for the lower magnetic layers of the memory chips (MRAM elements) 11 to function as MRAM and that does not affect magnetization reversal of the upper free layers.

The magnetic composite bodies 2a and 2b are provided with spacers 20a and 20b, respectively, so that the first magnetic field M1 that is based on the first anisotropic magnets 21a and 21b is applied to the memory chips 11 of the SO-DIMM unit 1 at an appropriate position.

When the SO-DIMM unit 1 is removed from the substrate 4, as illustrated in FIGS. 17A and 17B, the connector levers 40a and 40b are opened to push up the SO-DIMM unit 1 from the memory socket 4' for removal. Data stored in the memory chips (MRAM elements) 11 of the SO-DIMM unit 1 may be disrupted.

When the SO-DIMM unit 1 is removed from the memory socket 4' (substrate 4), data in the MRAM elements 11 may be disrupted if the SO-DIMM unit 1 is removed in an inclined state.

The SO-DIMM-type magnetic memory device is provided with the magnetic composite bodies 2a and 2b, but may be provided with the SO-DIMM unit 1 in substantially the same manner as an SO-DIMM for a desktop personal computer.

In the magnetic memory device discussed above, stored data may be disrupted with relatively low electrical power, and the possibility of data read-out or decoding (alteration) after the data disruption may be reduced.

When the magnetic memory main body is inappropriately taken out, stored data may be reliably disrupted, which may reduce the possibility of data leakage. When the magnetic memory main body which has been removed is attached, stored data has been disrupted, which allows the magnetic memory device to be reused after being newly initialized as a magnetic memory device.

Figure 18A:
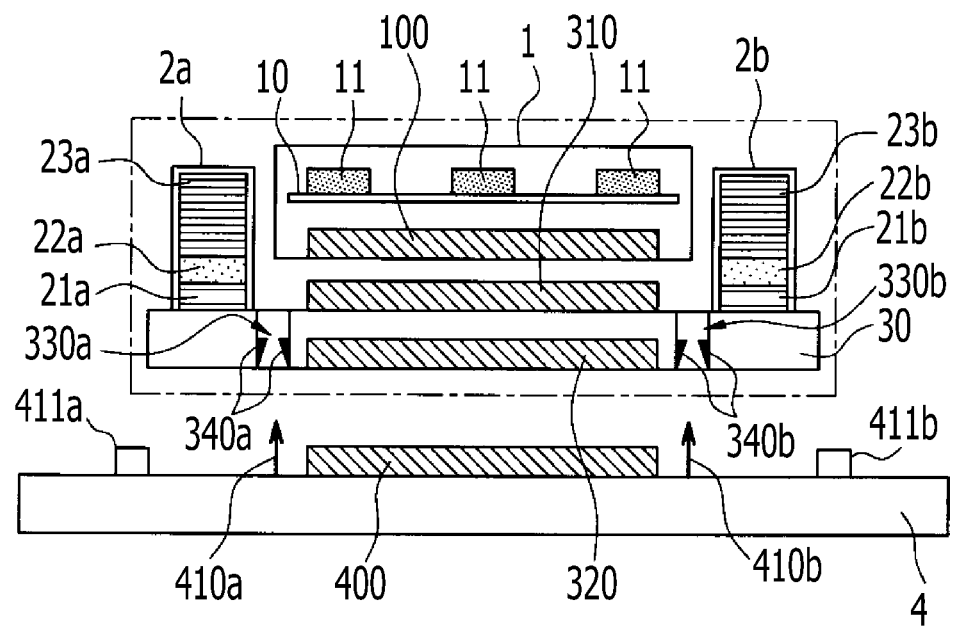
FIGS. 18A and 18B illustrate an exemplary magnetic memory device.
Figure 18B:
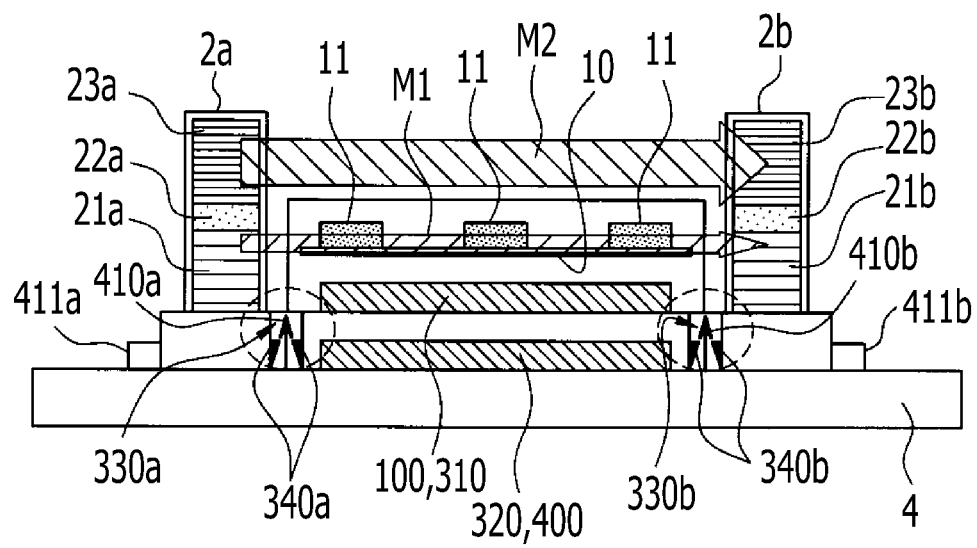

FIGS. 18A and 18B illustrate an exemplary magnetic memory device. The magnetic composite bodies 2a and 2b facing each other are fixed to the substrate 4, for example a motherboard. Therefore, the magnetic composite bodies 2a and 2b may not be removed together with the MRAM main body, for example the SSD unit 1.

In the magnetic memory device illustrated in FIG. 18, the magnetic composite bodies 2a and 2b facing each other are fixed to a dedicated substrate 30, for example a substrate for the SSD unit 1 (unit substrate). Once attached to the motherboard 4, the unit substrate 30 may not be removed from the motherboard 4.

FIG. 18A illustrates a state in which the SSD unit 1, the unit substrate 30, and the motherboard 4 are separated from each other. FIG. 18B illustrates a state in which the SSD unit 1, the unit substrate 30, and the motherboard 4 are fitted with each other.

The SSD unit 1 is removably provided on the unit substrate 30, to which the magnetic composite bodies 2a and 2b are fixed, through connectors 100 and 310. For example, the SSD unit 1 is electrically coupled through the connector 100 of the SSD unit 1 and the connector 310 of the unit substrate 30.

The unit substrate 30 is electrically coupled through a connector 320 of the unit substrate 30 and a connector 400 of the motherboard 4. Each of the connectors 100, 310, 320, and 400 include a plurality of metal terminals (connection pins).

Lock mechanisms (female portions) 330a and 330b provided in the unit substrate 30 are fitted with lock mechanisms (male portions) 410a and 410b of the motherboard 4. Hook portions 340a and 340b are formed in the lock mechanisms 330a and 330b, respectively, of the unit substrate 30. Once the lock mechanisms 330a and 330b are fitted with the lock mechanisms 410a and 410b, respectively, of the motherboard 4, the unit substrate 30 may not be removed because of the hook portions 340a and 340b.

The motherboard 4 is provided with alignment portions 411a and 411b to allow the unit substrate 30 to be aligned at a given position of the motherboard 4.

In FIGS. 18A and 18B, the removal of the unit substrate 30 from the motherboard 4 may be reduced because of the lock mechanisms 330a and 330b, the lock mechanisms 410a and 410b, and the hook portions 340a and 340b.

The unit substrate 30 may only be removed from the motherboard 4 using a dedicated removal tool that is difficult to obtain, for example. The unit substrate 30 may be attached to the motherboard 4 using an adhesive or the like so as not to be removable.

When the magnetic memory main body is inappropriately taken out, for example, stored data is disrupted (erased), which may reduce the possibility of data leakage.

Magnetic memory devices in which the magnetic composite bodies 2a and 2b, the connectors 310 and 100, and the SSD unit (MRAM main body) 1 are provided on the unit substrate 30 may be sold to other companies.

In the provided products, the positional relationship among the memory main body 1 and the magnetic composite bodies 2a and 2b (the anisotropic magnets 21a and 21b and 23a and 23b) has been set by the manufacturer of the magnetic memory devices. Therefore, the products may be managed strictly.

In personal computer assembly companies that have purchased the magnetic memory devices, the magnetic memory device (unit substrate 30) may be fixed to the motherboard 4 using technologies known in the art. An effect that is substantially the same as or similar to the effect of the magnetic memory device described above may be obtained.

The magnetic memory device may be applied to laptop personal computers, desktop personal computers, portable terminals, or various electronic devices.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A memory device comprising:
   a memory including a first magnetic layer having no retaining force and a second magnetic layer having a retaining force, the first magnetic layer and the second magnetic layer being stacked;

a first magnet to magnetize the first magnetic layer in a first direction; and a second magnet to apply a magnetic field to a region through which the memory passes when the memory is removed and to magnetize the second magnetic layer in a second direction.

2. The memory device according to claim 1,
wherein the memory stores data in accordance with a spin direction of the memory.

3. The memory device according to claim 1,
wherein the first magnet is provided at a position at which the first magnetic layer is released from the effects of magnetization in the first direction when the memory is removed.

4. The memory device according to claim 1,
wherein the second magnet is provided at a position at which the second magnet does not affect magnetization of the first magnetic layer and the second magnetic layer when the memory is attached.

5. The memory device according to claim 1,
wherein the first magnet and the second magnet are stacked with a shielding material in-between, and provided on both sides of the memory to apply a magnetic field in substantially the same direction to the memory.

6. The memory device according to claim 5,
wherein the first magnet, the shielding material, and the second magnet are packaged as a magnetic field generating unit, and
the magnetic field generating units is provided on both sides of the memory so that the magnetic field generating units are across from each other.

7. The memory device according to claim 6,
wherein the memory is formed as a solid state drive (SSD) unit, and
the magnetic field generating unit is provided on both sides of the SSD unit so that the magnetic field generating units are across from each other.

8. The memory device according to claim 6,
wherein the memory is formed as a small outline dual in-line memory module (SO-DIMM) unit, and
the magnetic field generating unit is provided on both sides of a memory socket for attachment of the SO-DIMM unit so that the magnetic field generating units are across from each other.

9. The memory device according to claim 1,
wherein the first magnet and the second magnet are anisotropic magnets.

10. An electronic apparatus comprising:
a memory device; and
a controller to control the memory device,
wherein the memory device includes;
a memory in which a first magnetic layer having no retaining force and a second magnetic layer having a retaining force are stacked;
a first magnet to magnetize the first magnetic layer in a first direction; and
a second magnet to apply a magnetic field to a region through which the memory passes when the memory is removed and to magnetize the second magnetic layer in a second direction.

11. The electronic apparatus according to claim 10,
wherein the first magnet and the second magnet are stacked with a shielding material in-between, and provided on both sides of the memory to apply a magnetic field in substantially the same direction to the memory.

12. The electronic apparatus according to claim 10,
wherein the first magnet, the shielding material, and the second magnet are packaged as a magnetic field generating unit, and
the magnetic field generating units is provided on both sides of the memory so that the magnetic field generating units are across from each other.

13. The electronic apparatus according to claim 10,
wherein the electronic apparatus is a laptop personal computer or a desktop personal computer.

* * * * *